United States Patent
Kohama et al.

(10) Patent No.: US 12,322,599 B2
(45) Date of Patent: Jun. 3, 2025

(54) SUBSTRATE PROCESSING METHOD, MODIFICATION DEVICE AND SUBSTRATE PROCESSING SYSTEM

(71) Applicant: Tokyo Electron Limited, Tokyo (JP)

(72) Inventors: Norifumi Kohama, Koshi (JP); Takayuki Ishii, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 763 days.

(21) Appl. No.: 16/973,515

(22) PCT Filed: May 29, 2019

(86) PCT No.: PCT/JP2019/021264
§ 371 (c)(1),
(2) Date: Dec. 9, 2020

(87) PCT Pub. No.: WO2019/239892
PCT Pub. Date: Dec. 19, 2019

(65) Prior Publication Data
US 2021/0242027 A1   Aug. 5, 2021

(30) Foreign Application Priority Data
Jun. 12, 2018   (JP) .................................. 2018-111598

(51) Int. Cl.
*H01L 21/304* (2006.01)
*B23K 26/324* (2014.01)
*B23K 26/53* (2014.01)
*H01L 21/263* (2006.01)
(Continued)

(52) U.S. Cl.
CPC .......... *H01L 21/304* (2013.01); *B23K 26/324* (2013.01); *B23K 26/53* (2015.10);
(Continued)

(58) Field of Classification Search
CPC ................. H01L 21/304; H01L 21/263; H01L 21/67092; H01L 21/67115;
(Continued)

(56) References Cited

U.S. PATENT DOCUMENTS

| | | | | |
|---|---|---|---|---|
| 2014/0055599 A1* | 2/2014 | Koga | ................. | G01N 21/9503 |
| | | | | 348/87 |
| 2015/0069578 A1* | 3/2015 | Buenning | ............ | H01L 21/784 |
| | | | | 257/620 |

FOREIGN PATENT DOCUMENTS

| | | |
|---|---|---|
| CN | 108140556 A | 6/2018 |
| JP | 2004-207436 A | 7/2004 |

(Continued)

OTHER PUBLICATIONS

International Search Report for PCT/JP2019/021264 dated Jul. 2, 2019.

*Primary Examiner* — Cynthia L Schaller
(74) *Attorney, Agent, or Firm* — Chrisman Gallo Tochtrop LLC

(57) ABSTRACT

A substrate processing method of processing a substrate includes: forming a modification layer at least on a surface layer of a rear surface of the substrate or within the substrate by radiating a laser beam; and processing a front surface of the substrate in a state that the rear surface of the substrate is held. A modification device includes a laser irradiation unit configured to form a modification layer at least on a surface layer of the rear surface of the substrate or within the substrate by radiating a laser beam.

5 Claims, 11 Drawing Sheets

(51) Int. Cl.
  *H01L 21/67* (2006.01)
  *H01L 21/687* (2006.01)
  *B23K 103/00* (2006.01)

(52) U.S. Cl.
  CPC ...... *H01L 21/263* (2013.01); *H01L 21/67092* (2013.01); *H01L 21/67115* (2013.01); *H01L 21/68764* (2013.01); *B23K 2103/56* (2018.08)

(58) Field of Classification Search
  CPC ............ H01L 21/68764; H01L 21/187; H01L 21/0274; H01L 21/67178; H01L 21/6838; H01L 21/268; H01L 21/6715; B23K 26/324; B23K 26/53; B23K 2103/56; B23K 26/0823; B23K 26/0853; B23K 26/0884; B23K 2101/40; B23K 26/0006; B23K 26/57
  See application file for complete search history.

(56) References Cited

FOREIGN PATENT DOCUMENTS

| | | |
|---|---|---|
| JP | 2010-165817 A | 7/2010 |
| JP | 2012-099516 A | 5/2012 |
| JP | 2013-258365 A | 12/2013 |
| JP | 2014-041956 A | 3/2014 |
| JP | 2015-032690 A | 2/2015 |
| JP | 2015-185730 A | 10/2015 |
| JP | 2015-220410 A | 12/2015 |
| JP | 2017-069271 A | 4/2017 |
| JP | 2018-049997 A | 3/2018 |
| KR | 10-2015-0016115 A | 2/2015 |
| KR | 10-2016-0134783 A | 11/2016 |
| WO | 2015/144700 A2 | 10/2015 |
| WO | 2017/034533 A1 | 3/2017 |

* cited by examiner

SUBSTRATE PROCESSING METHOD, MODIFICATION DEVICE AND SUBSTRATE PROCESSING SYSTEM

CROSS-REFERENCE TO RELATED APPLICATION

This application claims the benefit of Japanese Patent Application No. 2018-111598 filed on Jun. 12, 2018, the entire disclosures of which are incorporated herein by reference.

TECHNICAL FIELD

The various aspects and embodiments described herein pertain generally to a substrate processing method, a modification device and a substrate processing system.

BACKGROUND

Patent Document 1 discloses an apparatus for bonding two wafers. In the bonding apparatus, a central portion of an upper wafer in the two wafers facing each other in a vertical direction is pressed down first by a push pin to bring the central portion into contact with a lower wafer. Thereafter, a spacer supporting the upper wafer is retreated to bring an entire surface of the upper wafer into contact with an entire surface of the lower wafer, and, thus, the wafers are bonded to each other.

Patent Document 1: Japanese Patent Laid-open Publication No. 2004-207436

In one exemplary embodiment, a substrate processing method of processing a substrate includes: forming a modification layer at least on a surface layer of a rear surface of the substrate or within the substrate by radiating a laser beam; and processing a front surface of the substrate in a state that the rear surface of the substrate is held.

DETAILED DESCRIPTION

Figure 1:
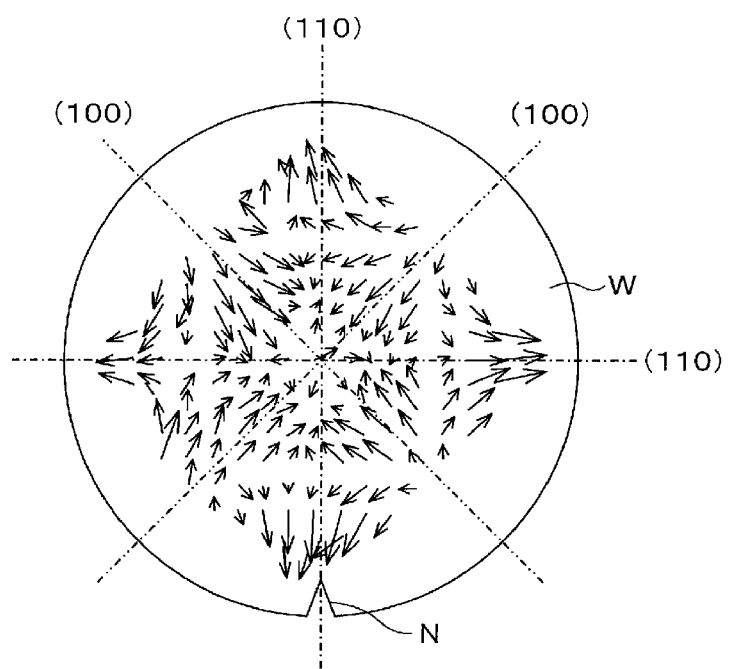
FIG. 1 is an explanatory diagram illustrating a relationship between a crystal orientation and distortion of a substrate.

First, a conventional substrate bonding apparatus and bonding method will be described.

In a three-dimensional integration technology by which semiconductor devices are stacked three-dimensionally, two semiconductor substrates (hereinafter referred to as "substrates") are bonded to each other. Specifically, for example, the substrates are bonded to each other by Van der Waals forces and hydrogen bonds (intermolecular forces). In order to appropriately manufacture a semiconductor device, it is important appropriately to adjust a position of a first substrate to be arranged at an upper side and a position of a second substrate to be arranged at a lower side when the substrates are stacked by being bonded. That is, a position of a pattern formed in the first substrate needs to be matched with a position of a pattern formed in the second substrate.

However, when the substrates are bonded to each other, the first substrate and the second substrate may be deviated due to various factors. For example, when the apparatus described in Patent Document 1 is used, a central portion of a first substrate is moved down toward a central portion of a second substrate by a push pin while an outer peripheral portion of the first substrate is held by an upper chuck, and, thus, the first substrate is elongated downwards in a convex manner. As a result, in the bonded substrates (hereinafter referred to as "combined substrates"), even if the central portions of the first substrate and the second substrate coincide with each other, outer peripheral portions thereof may be deviated in a horizontal direction (Scaling). Also, a ratio of size between the first substrate and the second substrate may be changed.

In addition to this Scaling, a position deviation such as Translation, Rotation, Orthogonality or the like also occurs. The term "Translation" refers to a case where the position of the first substrate is entirely deviated in the horizontal direction with respect to the second substrate. The term "Rotation" refers to a case where the first substrate is rotated to be deviated with respect to the second substrate. The term "Orthogonality" refers to a case where the orthogonality of the pattern in the first substrate deviates from the pattern in the second substrate. These deviations such as Scaling, Translation, Rotation, Orthogonality and the like can be calculated using a model. The model is derived, for example, by measuring the positions (coordinates) of respective points in the first substrate and the second substrate and by performing least square approximation of the measurement result. Then, by correcting bonding conditions based on the calculation result using the model, the deviations can be eliminated.

However, even if the above-described correction eliminates the deviations such as Scaling, Translation, Rotation, Orthogonality or the like, the position deviation in the horizontal direction may randomly remain in the substrate plane. Hereinafter, any position deviation that cannot be eliminated by this correction will be referred to as "Distortion". Due to Distortion, for example, a position deviation between the pattern in the first substrate and the pattern in the second substrate occurs in the combined substrates.

As a result of intensive study by the present inventors, it is found that Distortion is caused by a difference in the crystal orientation in the substrate plane. The difference in crystal orientation includes a difference in the denseness/sparseness of a pattern formed on a substrate. Hereinafter, for example, a case where the substrate is a silicon wafer and has crystal planes with Miller indices of (110) and (100) will be described. The (110) crystal plane and the (100) crystal plane are different in Young's modulus and Poisson's ratio. That is, the (110) crystal plane and the (100) crystal plane are different in the amount of extension/contraction of the substrate. Then, as described above, when a center of a substrate is pressed down by a push pin and the substrate is deformed into a convex shape, the amount of elongation varies in the substrate plane due to the difference in the crystal orientation. In other words, the stress applied to the inside of the substrate varies in the substrate plane. Then, the substrate is distorted due to the difference in the amount of elongation, and Distortion randomly occurs in the substrate plane.

Specifically, as shown in FIG. 1, a substrate W has, for example, (110) crystal planes in the directions of 0° and 90° with respect to a position of a notch N and (100) crystal planes in the direction of 45°. In this case, the present inventors calculates Distortion occurring in the substrate W after being bonded. When Distortion is calculated, an actual measurement value of the amount of elongation is measured from each point in the plane of the substrate W after being bonded and linear elements (Scaling, Translation, Rotation, Orthogonality) are calculated using the above-described model. Then, Distortion is calculated by subtracting the model calculation value from the actual measurement value. FIG. 1 shows an example of the result. In FIG. 1, the amount and the direction of Distortion at each point in the plane of the substrate W are indicated by an arrow. Referring to FIG. 1, the crystal orientation of the substrate W corresponds well to the direction of Distortion, and, thus, it can be seen that Distortion is caused by the difference in the crystal orientation in the substrate plane.

Hereinafter, a modification device, a substrate processing system equipped with the modification device and a substrate processing method according to a first exemplary embodiment for suppressing Distortion will be described with reference to the accompanying drawings. Further, in the present specification and drawings, elements that have substantially the same function and structure are denoted with the same reference numeral, and repeated explanation is omitted.

Figure 2:
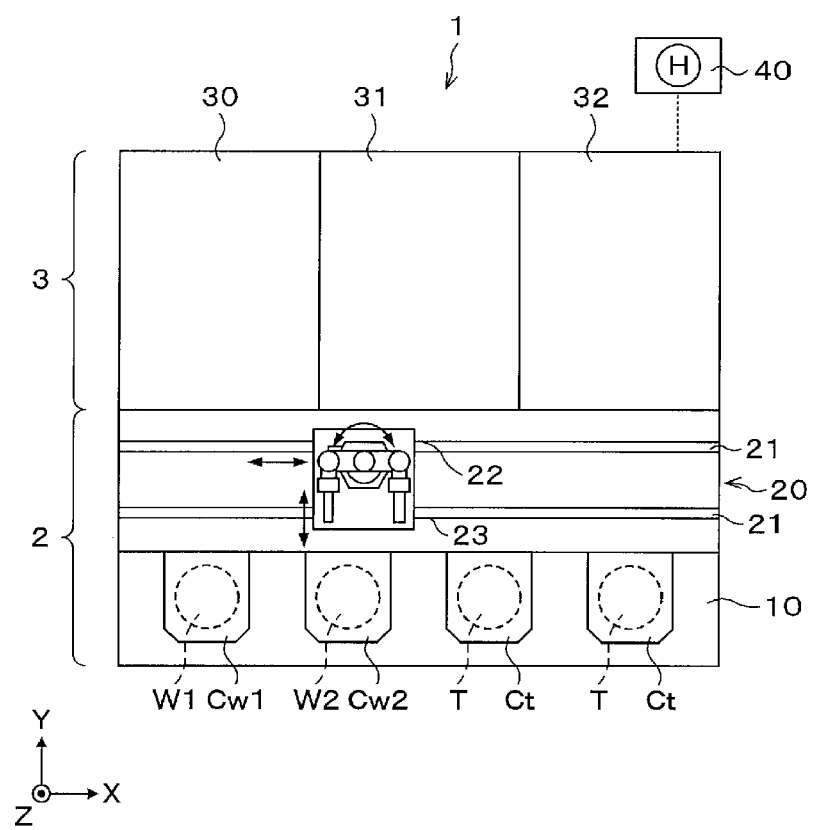
FIG. 2 is a plan view schematically illustrating a configuration of a substrate processing system according to a first exemplary embodiment.

First, a configuration of a substrate processing system according to a first exemplary embodiment will be described. FIG. 2 is a plan view schematically illustrating a configuration of a substrate processing system 1.

Figure 3:
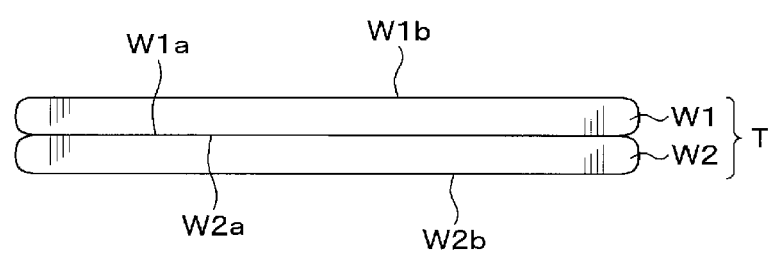
FIG. 3 is a schematic side view illustrating a configuration of a combined substrate.

In the substrate processing system 1, as shown in FIG. 3, a first substrate W1 and a second substrate W2 are bonded to form a combined substrate T, and the first substrate W1 is processed. Hereinafter, a surface of the first substrate W1 bonded to the second substrate W2 will be referred to as "front surface W1a", and a surface opposite to the front surface W1a will be referred to as "rear surface W1b". Also, in the second substrate W2, a surface bonded to the first substrate W1 will be referred to as "front surface W2a", and a surface opposite to the front surface W2a is referred to as "rear surface W2b". Further, each of the first substrate W1 and the second substrate W2 is a semiconductor substrate such as a silicon substrate, and a plurality of patterns is formed therein. Furthermore, each of the first substrate W1 and the second substrate W2 has (110) crystal planes and (100) crystal planes as shown in FIG. 1.

As shown in FIG. 2, the substrate processing system 1 includes a carry-in/out station 2 and a processing station 3 which are connected as one body. Cassettes Cw1, Cw2 and Ct which can accommodate a plurality of first substrates W1, a plurality of second substrates W2 and a plurality of combined substrates T, respectively, are carried in/out between the carry-in/out station 2 and, for example, the outside. The processing station 3 includes various processing devices configured to perform predetermined processings on the first substrate W1, the second substrate W2, the combined substrate T.

In the carry-in/out station 2, a cassette placing table 10 is provided. In the illustrated example, a plurality of, for example, four cassettes Cw1, Cw2 and Ct can be arranged in a row in an X-axis direction on the cassette placing table 10. Further, the number of cassettes Cw1, Cw2 and Ct arranged on the cassette placing table 10 is not limited to the present exemplary embodiment, but can be arbitrarily determined.

In the carry-in/out station 2, a transfer section 20 is provided adjacent to the cassette placing table 10. The transfer section 20 is equipped with a transfer device 22 which is movable along a transfer path 21 elongated in the X-axis direction. The transfer device 22 is configured to hold and transfer the first substrate W1, the second substrate W2 and the combined substrate T, and has, for example, two transfer arms 23 and 23. Each transfer arm 23 is movable in a horizontal direction, in a vertical direction, around a horizontal axis and around a vertical axis. Also, the configuration of the transfer arm 23 is not limited to the present exemplary embodiment, but can be arbitrarily determined.

On the positive side of a Y-axis direction of the transfer section 20 in the processing station 3, a modification device 30, a bonding device 31 and a processing device 32 are arranged in parallel with each other from the negative side toward the positive side of the X-axis direction. The modification device 30 is configured to form a modification layer in the first substrate W1. The bonding device 31 is configured to bond the first substrate W1 and the second substrate W2 to each other. The processing device 32 is configured to grind and process the rear surface W1b of the first substrate W1. Also, the number and the arrangement of the modification device 30, the bonding device 31 and the processing device 32 is not limited to the present exemplary embodiment, but can be arbitrarily determined.

The substrate processing system 1 described above is equipped with a control device 40. The control device 40 is, for example, a computer, and is provided with a program storage (not shown). The program storage stores a program for controlling processings of the first substrate W1, the second substrate W2 and the combined substrate T in the substrate processing system 1. Also, the program storage stores a program for controlling operations of a driving unit such as the above-described processing devices and the transfer devices to implement a substrate processing, which will be described below, in the substrate processing system 1. Further, the program is recorded in a computer-readable recording medium H and may be installed on the control device 40 from the recording medium H.

Hereinafter, the modification device 30, the bonding device 31 and the processing device 32 will be described. In the following description, the processing device 32, the bonding device 31 and the modification device 30 will be described in this order for the sake of easy understanding.

The processing device 32 grinds and processes the rear surface W1*b* of the first substrate W1 in the combined substrate T formed by the bonding device 31. Specifically, the processing device 32 is equipped with, for example, a grinding unit configured to grind the rear surface W1*b*, a cleaning unit configured to clean the rear surface W1*b* of the first substrate W1 and the rear surface W2*b* of the second substrate W2, and the like. Also, the configuration of the processing device 32 is arbitrary, and a processing device known in the art may be used.

The bonding device 31 bonds the front surface W1*a* of the first substrate W1 and the front surface W2*a* of the second substrate W2 to each other by Van der Waals forces and hydrogen bonds (intermolecular forces). Specifically, the bonding device 31 is equipped with, for example, a bonding unit configured to bond the first substrate W1 and the second substrate W2 to each other, an activating unit configured to activate the front surface W1*a* and the front surface W2*a*, a hydrophilizing unit configured to hydrophilize the front surface W1*a* and the front surface W2*a*, and the like. In the activating unit, an oxygen gas or nitrogen gas as a processing gas is excited into plasma to be ionized, for example, under a depressurized atmosphere. The oxygen ions or nitrogen ions are irradiated onto the front surface W1*a* and the front surface W2*a*, and, thus, the front surface W1*a* and the front surface W2*a* are plasma-processed to be activated. In the hydrophilizing unit, pure water is supplied onto the activated front surface W1*a* and front surface W2*a* to hydrophilize the front surface W1*a* and the front surface W2*a*. Then, in the bonding unit, the activated and hydrophilized front surface W1*a* and front surface W2*a* are bonded to each other.

Figure 4:
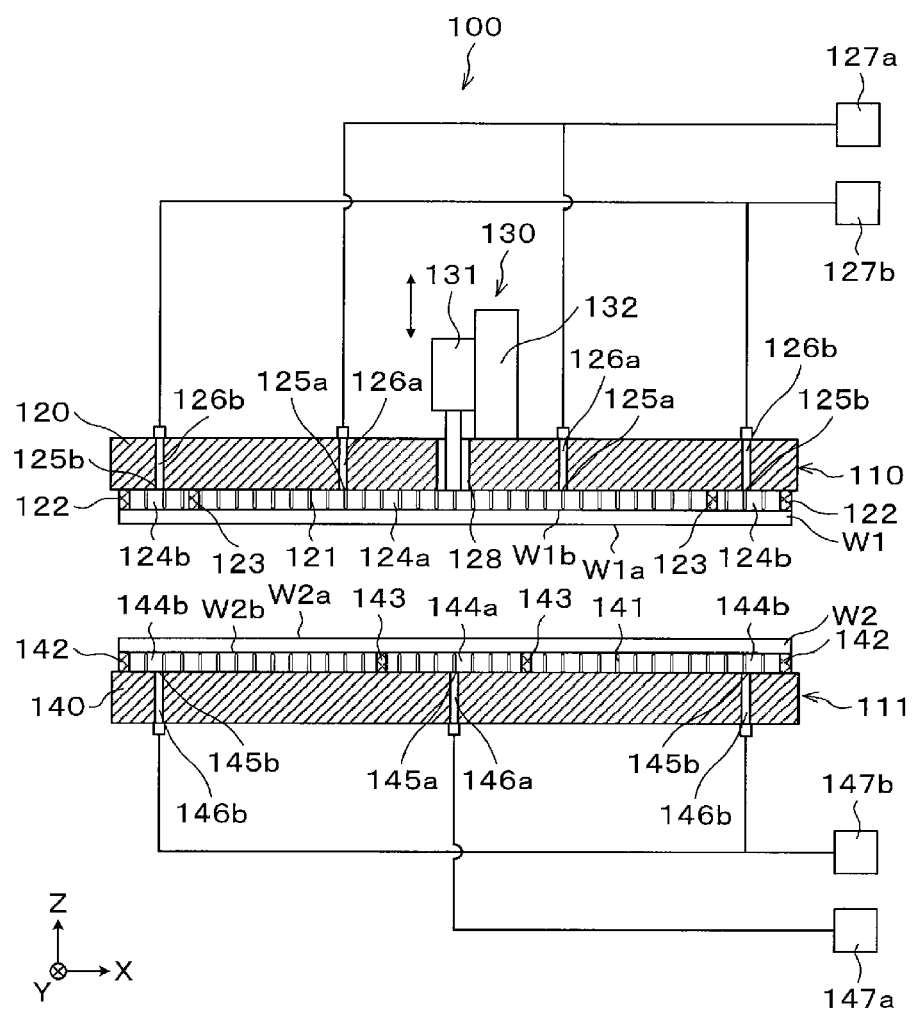
FIG. 4 is a schematic longitudinal cross sectional view illustrating a configuration of a bonding unit.

As shown in FIG. 4, a bonding unit 100 is equipped with a first holder 110 configured to attract and hold the rear surface W1*b* of the first substrate W1; and a second holder 111 configured to attract and hold the rear surface W2*b* of the second substrate W2. The second holder 111 is provided under the first holder 110 and arranged to face the first holder 110. That is, the first substrate W1 held by the first holder 110 and the second substrate W2 held by the second holder 111 are arranged to face each other. Further, the second holder 111 is configured to be movable in the X-axis direction, in the Y-axis direction and in the Z-axis direction by a moving mechanism (not shown) and also configured to be rotatable around a vertical axis.

The first holder 110 employs a pin chuck system. The first holder 110 has a main body 120 having a larger diameter than at least the first substrate W1 when viewed from the top. A plurality of pins 121 in contact with the rear surface W1*b* of the first substrate W1 is provided on a lower surface of the main body 120. Also, an outer wall 122 configured to support an outer peripheral portion of the rear surface W1*b* of the first substrate W1 is provided on the lower surface of the main body 120. The outer wall 122 is formed into a ring shape and arranged outside the plurality of pins 121.

Further, a partition wall 123 is provided inside the outer wall 122 on the lower surface of the main body 120. The partition wall 123 is formed into a ring shape to be concentric with the outer wall 122. A region 124 (hereinafter also referred to as "suction region 124") inside the outer wall 122 is divided into a first suction region 124*a* inside the partition wall 123 and a second suction region 124*b* outside the partition wall 123.

On the lower surface of the main body 120, a first suction port 125*a* for vacuum-attracting the first substrate W1 is formed in the first suction region 124*a*. For example, the first suction port 125*a* is formed at two locations in the first suction region 124*a*. A first suction pipe 126*a* provided within the main body 120 is connected to the first suction port 125*a*. Further, a first vacuum pump 127*a* is connected to the first suction pipe 126*a*.

In addition, on the lower surface of the main body 120, a second suction port 125*b* for vacuum-attracting the first substrate W1 is formed in the second suction region 124*b*. For example, the second suction port 125*b* is formed at two locations in the second suction region 124*b*. A second suction pipe 126*b* is provided within the main body 120 to be connected to the second suction port 125*b*. Further, a second vacuum pump 127*b* is connected to the second suction pipe 126*b*.

In the first holder 110, a through-hole 128 that penetrates through the main body 120 in a thickness direction is formed at a central portion of the main body 120. The central portion of the main body portion 120 corresponds to a central portion of the first substrate W1 that is attracted and held by the first holder 110. Further, a tip end portion of an actuator member 131 in a push member 130, which will be described below, is inserted through the through-hole 128.

The push member 130 configured to press the central portion of the first substrate W1 down is provided on an upper surface of the first holder 110. The push member 130 has the actuator member 131 and a cylinder member 132. The push member 130 controls a pressing load applied to the central portion of the first substrate W1 by the actuator member 131, and controls a vertical movement of the actuator member 131 by the cylinder member 132. Then, the push member 130 can press the central portion of the first substrate W1 and the central portion of the second substrate W2 into contact with each other while the first substrate W1 and the second substrate W2 are bonded to each other.

As in the first holder 110, the second holder 111 employs the pin chuck system. The second holder 111 has a main body 140 having a larger diameter than at least the second substrate W2 when viewed from the top. A plurality of pins 141 in contact with the rear surface W2*b* of the second substrate W2 is provided on an upper surface of the main body 140. Also, an outer wall 142 configured to support an outer peripheral portion of the rear surface W2*b* of the second substrate W2 is provided on the upper surface of the main body 140. The outer wall 142 is formed into a ring shape and arranged outside the plurality of pins 141.

Further, a partition wall 143 is provided inside the outer wall 142 on the upper surface of the main body 140. The partition wall 143 is formed into a ring shape to be concentric with the outer wall 142. A region 144 (hereinafter also referred to as "suction region 144") inside the outer wall 142 is divided into a first suction region 144*a* inside the partition wall 143 and a second suction region 144*b* outside the partition wall 143.

On the upper surface of the main body 140, a first suction port 145*a* for vacuum-attracting the second substrate W2 is formed in the first suction region 144*a*. For example, the first suction port 145*a* is formed at two locations in the first suction region 144*a*. A first suction pipe 146*a* provided within the main body 140 is connected to the first suction port 145*a*. Further, a first vacuum pump 147*a* is connected to the first suction pipe 146*a*.

In addition, on the upper surface of the main body 140, a second suction port 145*b* for vacuum-attracting the second substrate W2 is formed in the second suction region 144*b*. For example, the second suction port 145*b* is formed at two locations in the second suction region 144*b*. A second suction pipe 146*b* provided within the main body 140 is connected to the second suction port 145b. Further, a second vacuum pump 147b is connected to the second suction pipe 146b.

Figure 5:
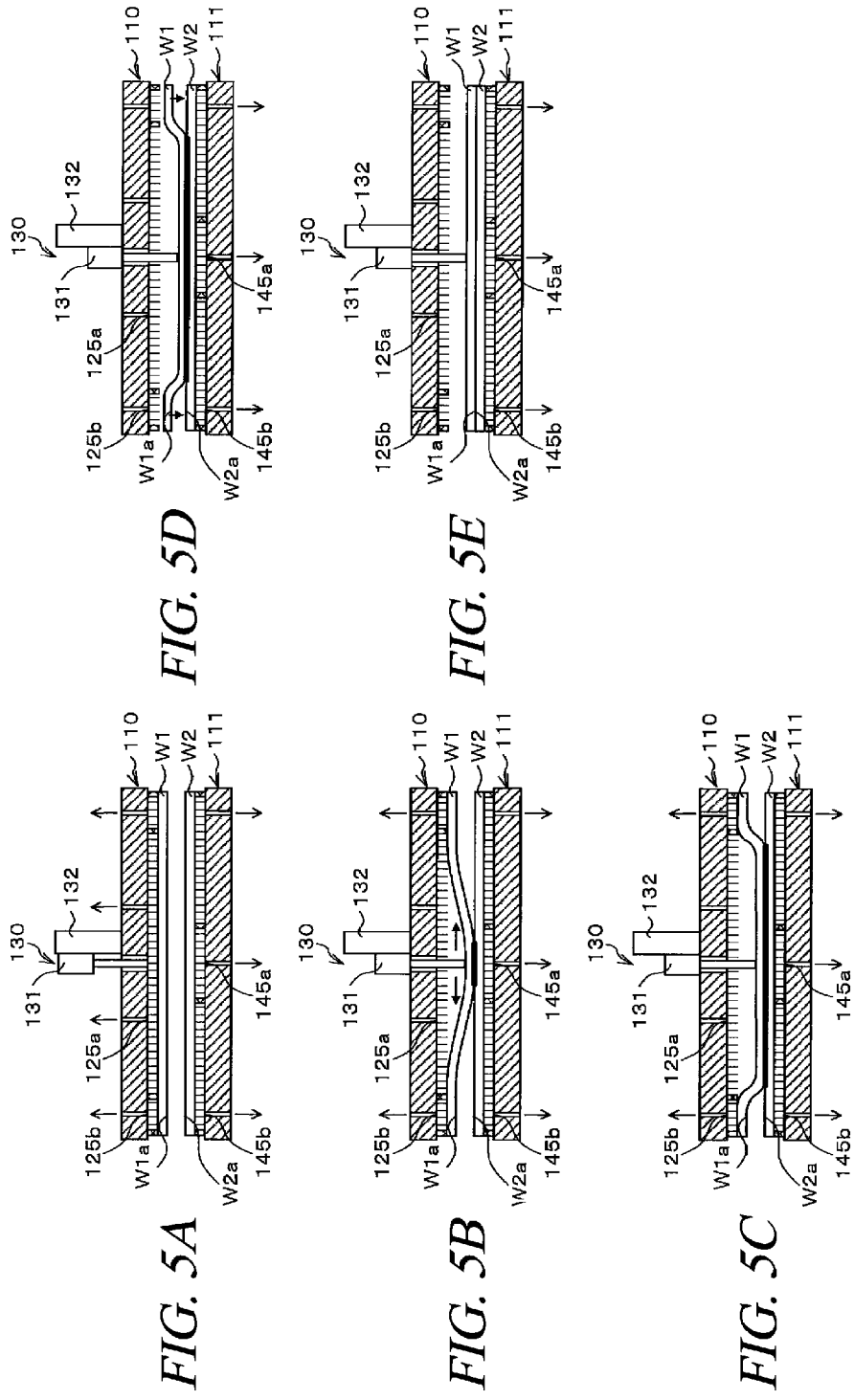
FIG. 5A to FIG. 5E are explanatory diagrams illustrating an operation where a first substrate and a second substrate are bonded to each other.

In the bonding unit 100, as shown in FIG. 5A, the first substrate W1 is first vacuum-exhausted from the suction ports 125a and 125b, and, thus, the rear surface W1b of the first substrate W1 is attracted and held by the first holder 110. Further, the second substrate W2 is vacuum-exhausted from the suction ports 145a and 145b, and, thus, the rear surface W2b of the second substrate W2 is attracted and held by the second holder 111. Thereafter, the first substrate W1 and the second substrate W2 are subjected to a position adjustment (alignment) in the horizontal direction and in the vertical direction.

Then, as shown in FIG. 5B, the actuator member 131 is moved down by the cylinder member 132 of the push member 130. As the actuator member 131 is moved down, the central portion of the first substrate W1 is pressed and moved down. Also, the push member 130 presses the central portion of the first substrate W1 and the central portion of the second substrate W2 into contact with each other. Here, the vacuum-exhausting of the first substrate W1 from the first suction portion 125a is stopped. Then, bonding between the pressed central portion of the first substrate W1 and the pressed central portion of the second substrate W2 is started by Van der Waals forces and hydrogen bonds (as indicated by a bold line in FIG. 5B).

Thereafter, as shown in FIG. 5C, the bonding (bonding wave) between the front surface W1a and the front surface W2a spreads from the central portion to the outer peripheral portion. After a predetermined time period elapses, the bonding between the front surface W1a and the front surface W2a is completed almost over the entire surface except the outer peripheral portion.

Then, as shown in FIG. 5D, the vacuum-exhausting of the first substrate W1 from the second suction port 125b is stopped. Then, the outer peripheral portion of the first substrate W1 falls down on the second substrate W2. Thereafter, as shown in FIG. 5E, the front surface W1a is brought into contact with the front surface W2a throughout the entire surface, and, thus, the first substrate W1 and the second substrate W2 are bonded to each other.

Figure 6:
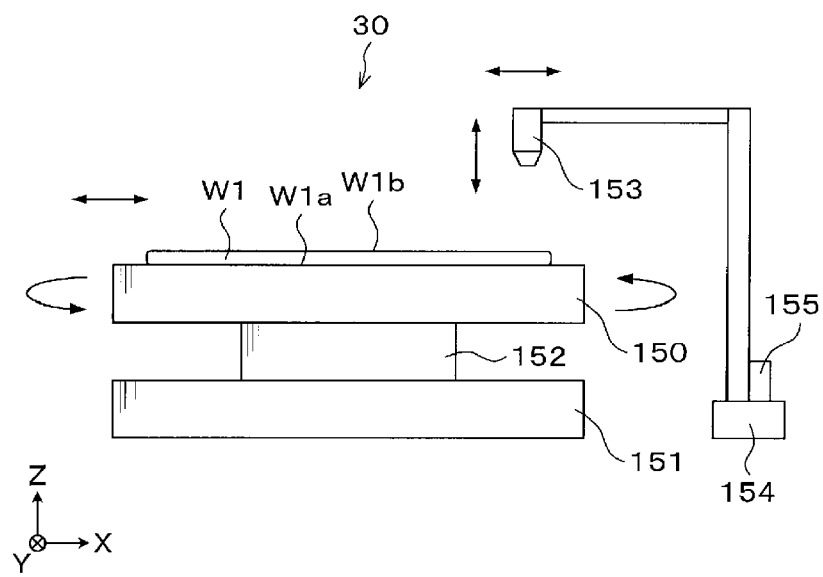
FIG. 6 is a schematic side view illustrating a configuration of a modification device.

The modification device 30 forms the modification layer by irradiating a laser beam into the first substrate W1 before the bonding. The modification device 30 is equipped with a holder 150 configured to hold the first substrate W1 whose rear surface W1b is arranged on the upper side and whose front surface W1a is arranged on the lower side as shown in FIG. 6. The holder 150 is configured to be movable in the X-axis direction and in the Y-axis direction by a moving mechanism 151. The moving mechanism 151 is configured as a general precise XY stage. Further, the holder 150 is configured to be rotatable around a vertical axis by a rotation mechanism 152.

Figure 7:
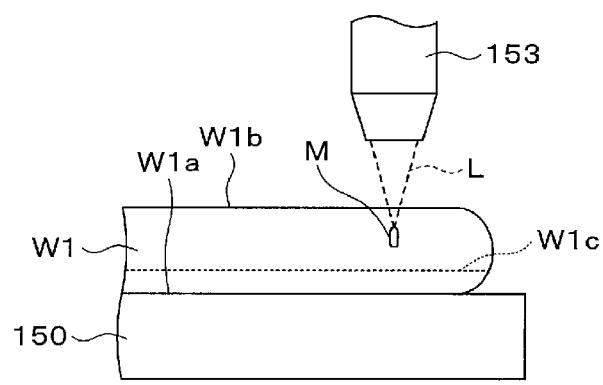
FIG. 7 is a longitudinal cross sectional view illustrating a modification layer formed in the first substrate.

A laser irradiation unit 153 configured to radiate a laser beam into the first substrate W1 is provided above the holder 150. The laser irradiation unit 153 focuses a high frequency pulse-shaped laser oscillated from a laser beam oscillator (not shown), i.e., a laser beam having a wavelength transmissive to the first substrate W1, to a predetermined position within the first substrate W1. Thus, in the first substrate W1, a portion where the laser beam L is focused is modified as shown in FIG. 7. Specifically, the portion where the laser beam L is focused becomes amorphous and a modification layer M is formed. The modification layer M is elongated in a depth direction and has a vertically long aspect ratio. As shown in FIG. 6, the laser irradiation unit 153 may be configured to be movable in the X-axis direction and in the Y-axis direction by a moving mechanism 154. The moving mechanism 154 is configured as a general precise XY stage. Further, the laser irradiation unit 153 may be configured to be movable in the Z-axis direction by an elevation mechanism 155.

In the modification device 30, the first substrate W1 is held by the holder 150, and then, the holder 150 is moved in the horizontal direction by the moving mechanism 151 to perform centering of the first substrate W1. Also, the position of the laser irradiation unit 153 is adjusted to be located right above the predetermined position of the first substrate W1 by the moving mechanism 154. Then, while the holder 150 is rotated by the rotation mechanism 152, the laser beam L is radiated into the first substrate W1 from the laser irradiation unit 153 to form the modification layer M. To perform the position adjustment, the modification device 30 may be further equipped with a camera (not shown) configured to image the position of the combined substrate T.

Further, in the modification device 30 according to the present exemplary embodiment, the holder 150 is moved in the horizontal direction, but the laser irradiation unit 153 may be moved in the horizontal direction or both the holder 150 and the laser irradiation unit 153 may be moved in the horizontal direction. Also, the holder 150 is rotated, but the laser irradiation unit 153 may be rotated.

Hereinafter, the position of the modification layer M formed in the first substrate W1 will be described in detail. In the substrate processing system 1, the rear surface W1b of the first substrate W1 bonded to the second substrate W2 is ground by the processing device 32. As shown in FIG. 7, a lower end of the modification layer M is located above a target plane (indicated by a dotted line in FIG. 7) of the ground first substrate W1. In this case, the processing device 32 grinds the rear surface W1b of the first substrate W1 including the modification layer M, and the modification layer M does not remain in the ground first substrate W1. Also, the modification layer M ground and removed herein includes a crack elongated from the modified portion.

Further, during the bonding as shown in FIG. 5A to FIG. 5E, the modification layer M is formed such that when the central portion of the first substrate W1 is pressed down by the push member 130 and the first substrate W1 is deformed into a convex shape, the elongation amount of the first substrate W1 is uniform in the substrate plane. As shown in FIG. 1, the first substrate W1 has (110) and (100) crystal planes, and a difference in the crystal orientation causes the difference in the elongation amount. The modification layer M is formed to correct the difference in the elongation amount and thus suppress Distortion.

As shown in FIG. 7, the modification layer M refers to a portion where the laser beam L radiated from the laser irradiation unit 153 is focused to become amorphous. Then, within the first substrate W1, the region where the modification M is formed becomes non-crystalline, and the elongation amount of the first substrate W1 changes. As a result, the difference in the crystal orientation of the first substrate W1 is eliminated, and the difference in the elongation amount caused by the difference in the crystal orientation can be corrected and suppressed. Also, since voids (cavities) are formed in the modification layer M, the elongation of the first substrate W1 can be absorbed by the voids, so that the elongation amount can be corrected.

Figure 8:
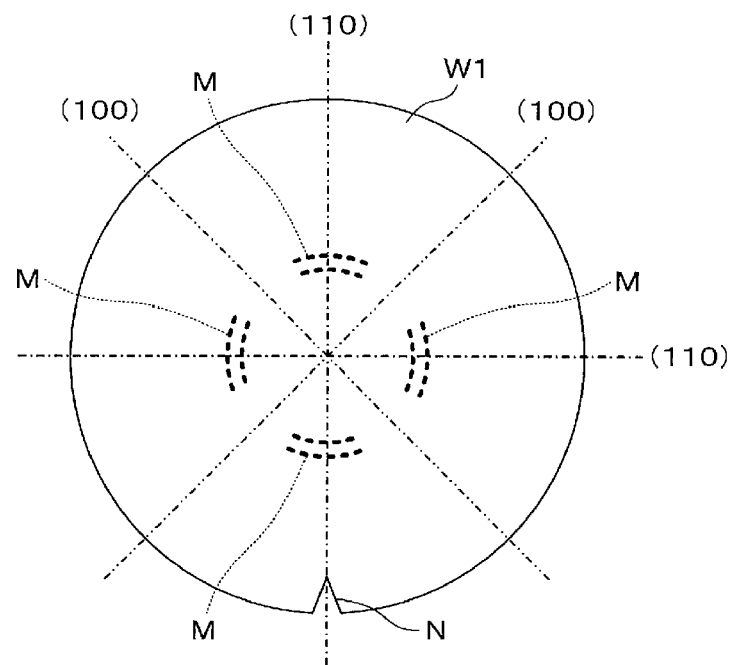
FIG. 8 is a plan view illustrating the modification layer formed in the first substrate.
Figure 9:
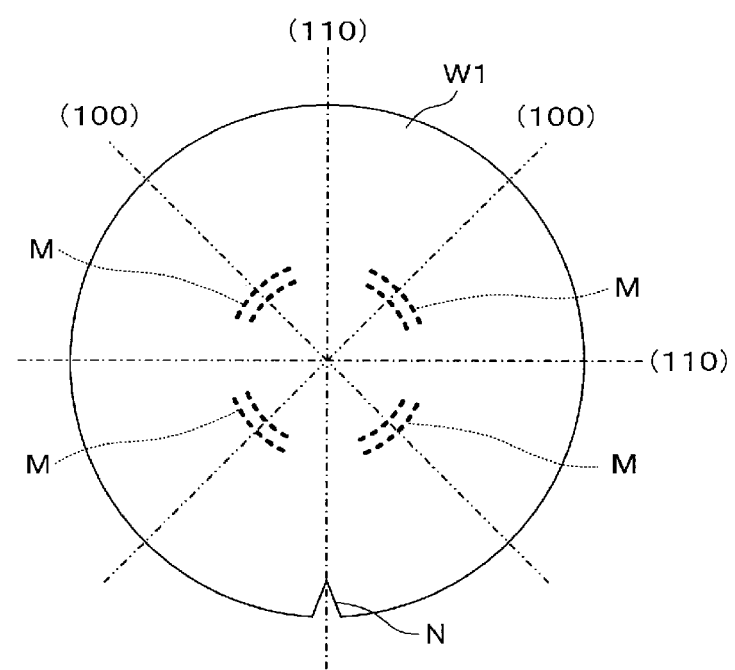
FIG. 9 is a plan view illustrating the modification layer formed in the first substrate.
Figure 10:
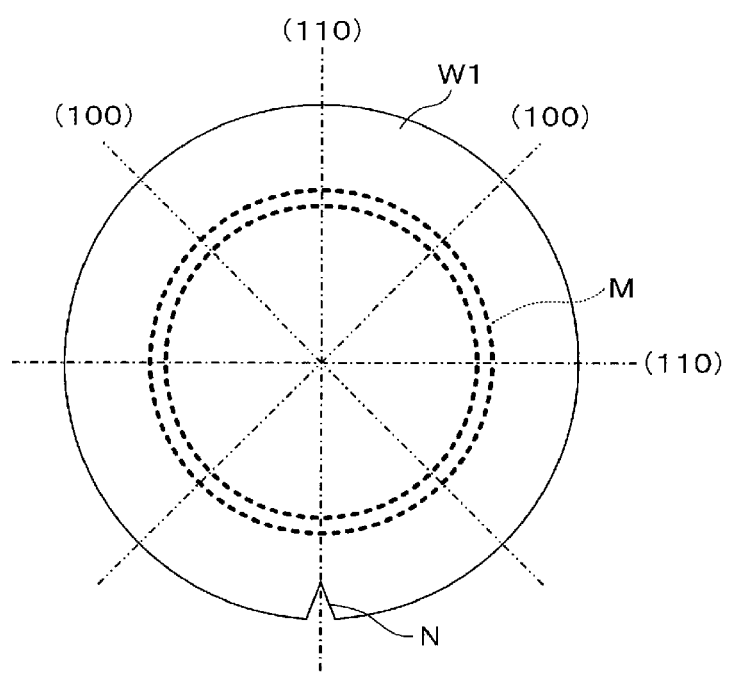
FIG. 10 is a plan view illustrating the modification layer formed in the first substrate.

Specifically, it is possible to arbitrarily determine the position of the modification layer M in the first substrate W1. For example, as shown in FIG. 8, the modification layer M may be formed as a double layer in a diametrical direction at positions corresponding to the (110) crystal planes. Otherwise, as shown in FIG. 9, the modification layer M may be formed as a double layer in the diametrical direction at positions corresponding to the (100) crystal planes. Also, as shown in FIG. 10, the modification layer M may be formed as a double layer in the diametrical direction to be concentric with the first substrate W1. The modification layer M may be formed as a single layer in the diametrical direction or may be formed as a triple layer or more. In any case, the modification layer M just needs to be formed such that the elongation amount of the first substrate W1 can be uniform in the substrate plane.

If the crystal orientation of the first substrate W1 is known before the substrate processing in the substrate processing system 1 as in the present exemplary embodiment, it is possible to arbitrarily control the positions of the modification layer M shown in FIG. 8 to FIG. 10 based on the crystal orientation. Also, if Distortion is known in advance, it is possible to arbitrarily control the position of the modification layer M. As such, the position of the modification layer M may be feed-forward controlled based on the crystal orientation or Distortion of the first substrate W1.

Further, the depth or the width of the modification layer M may be controlled in order to make the elongation amount of the first substrate W1 uniform. As shown in FIG. 5A to FIG. 5E, the bonding wave moves from the central portion to the outer peripheral portion. When the bonding wave reaches the outer peripheral portion, the stress applied to the first substrate W1 increases. That is, as the bonding wave moves, the stress applied to the first substrate W1 varies. Therefore, the degree of modification in the diametrical direction of the first substrate W1, for example, the depth or the width of the modification layer M, may be controlled depending on the magnitude of this stress. Furthermore, the modification layer M may be formed as a plurality of layers in the depth direction. However, even if the modification layer M is formed in a plurality of layers, it is desirable that all the modification layers M need to be removed by grinding the rear surface W1b in the processing device 32.

Hereinafter, a substrate processing performed in the substrate processing system 1 configured as described above will be described.

First, the cassette Cw1 that accommodates the first substrates W1 and the cassette Cw2 that accommodates the second substrates W2 are placed on the cassette placing table 10 of the carry-in/out station 2.

Then, the first substrate W1 is taken out of the cassette Cw1 by the transfer device 22 and transferred into the modification device 30. In the modification device 30, the laser beam L is radiated from the laser irradiation unit 153 into the first substrate W1 held on the holder 150. Further, within the first substrate W1, the portion where the laser beam L is focused is modified so that the modification layer M is formed. For example, as shown in FIG. 7, the modification layer M is formed such that the lower end thereof is located above the target plane W1c of the ground first substrate W1. Further, for example, as shown in FIG. 8 to FIG. 10, the modification layer M is formed such that the difference in the crystal orientation of the first substrate W1 is eliminated to suppress the difference in the elongation amount caused by the difference in the crystal orientation.

Then, the first substrate W1 in which the modification layer M is formed is transferred into the bonding device 31 by the transfer device 22. Subsequently, the second substrate W2 is taken out of the cassette Cw2 and transferred into the bonding device 31 by the transfer device 22. First, in the bonding device 31, the front surface W1a of the first substrate W1 and the front surface W2a of the second substrate W2 are activated by the activating unit, for example, with oxygen ions or nitrogen ions excited into plasma. Thereafter, the hydrophilizing unit supplies pure water onto the front surface W1a and the front surface W2a to hydrophilize the front surface W1a and the front surface W2a. Further, in the bonding device 31, for example, an inverting unit (not shown) appropriately inverses each of the first substrate W1 and the second substrate W2.

Thereafter, the bonding unit 100 bonds the activated and hydrophilized front surface W1a and front surface W2a to each other. Further, the first substrate W1 and the second substrate W2 are bonded to each other as described above with reference to FIG. 5A to FIG. 5E. During the bonding, the central portion of the first substrate W1 is pressed down by the push member 130 and the first substrate W1 is deformed into the convex shape. However, since the modification layer M is formed in the first substrate W1, the difference in the elongation amount caused by the difference in the crystal orientation can be suppressed. For this reason, even if the first substrate W1 is deformed into the convex shape, the elongation amount becomes uniform in the substrate plane. Therefore, Distortion can be suppressed during the bonding, and, thus, the first substrate W1 and the second substrate W2 can be appropriately bonded to each other.

Then, the combined substrate T in which the first substrate W1 and the second substrate W2 are bonded to each other is transferred into the processing device 32 by the transfer device 22. In the processing device 32, the rear surface W1b of the first substrate W1 in the combined substrate T is ground to the target plane W1c shown in FIG. 7. Then, the rear surface W1b of the first substrate W1 including the modification layer M is ground, and the modification layer M does not remain in the ground first substrate W1. Here, the modification layer M is amorphous and has low strength. Accordingly, in the present exemplary embodiment, the modification layer M does not remain in the ground first substrate W1, and, thus, high strength can be secured.

Subsequently, the combined wafer T subjected to all the required processings is transferred back into the cassette Ct on the cassette placing table 10 by the transfer device 22. Thus, a series of substrate processings in the substrate processing system 1 is ended.

As described above, according to the present exemplary embodiment, the modification device 30 forms the modification layer M within the first substrate W1. Thus, even if the first substrate W1 is deformed into the convex shape during the bonding by the bonding device 31, the difference in the elongation amount caused by the difference in the crystal orientation can be suppressed. For this reason, the elongation amount of the first substrate W1 becomes uniform in the substrate plane. Therefore, Distortion can be suppressed during the bonding, and, thus, the first substrate W1 and the second substrate W2 can be appropriately bonded to each other.

Further, according to the present exemplary embodiment, the lower end of the modification layer M formed within the first substrate W1 by the modification device 30 is located above the target plane W1c of the ground first substrate W1. For this reason, the rear surface W1b of the first substrate W1 including the modification layer M is ground and the modification layer M does not remain in the ground first substrate W1. For this reason, the ground first substrate W1 can have high strength.

In the first exemplary embodiment described above, the modification layer M is formed within the first substrate W1 by the modification device 30, but may be formed within the second substrate W2. Alternatively, the modification layer M may be formed within each of the first substrate W1 and the second substrate W2. In any case, the same effect as in the above-described exemplary embodiment can be obtained, i.e., Distortion can be suppressed during the bonding.

In the first exemplary embodiment described above, the modification layer M is formed within the first substrate W1 by the modification device 30, but may be formed on a surface layer of the rear surface W1b of the first substrate W1. Specifically, in the modification device 30, the laser beam L is radiated and focused on the surface layer of the rear surface W1b. Then, the modification layer M is formed in the portion where the laser beam L is focused.

Here, in the bonding device 31, the rear surface W1b of the first substrate W1 is attracted and held by the first holder 110. In this case, friction may occur between a holding surface of the first holder 110 and the rear surface W1b, and may cause a stress on the first substrate W1. When the stress is applied to the first substrate W1 in this way, the first substrate W1 is distorted.

In this regard, if the modification layer M is formed on the surface layer of the rear surface W1b as in the present exemplary embodiment, the rear surface W1b is roughened. Then, a frictional force between the roughened rear surface W1b and the holding surface of the first holder 110 decreases. As a result, the stress caused by the friction on the first substrate W1 can be suppressed, and, thus, the distortion of the first substrate W1 can be suppressed.

Further, in the modification device 30, the modification layer M may be formed on a surface layer of the rear surface W2b of the second substrate W2 as in the first substrate W1. In such a case, a frictional force between the roughened rear surface W2b and a holding surface of the second holder 111 decreases. As a result, the stress caused by the friction on the second substrate W2 can be suppressed, and, thus, the distortion of the second substrate W2 can also be suppressed.

Furthermore, in the modification device 30, the modification layer M may be formed on the rear surface W1b of the first substrate W1 and the entire surface of the second substrate W2 or may be locally formed. For example, if Distortion is known in advance, the modification layer M may be locally formed according to Distortion.

Moreover, in the modification device 30, the modification layer M may be formed both inside the first substrate W1 and on the surface layer of the rear surface W1b, or may be formed either inside the first substrate W1 or on the surface layer of the rear surface W1b. Similarly, the modification layer M may be formed both inside the second substrate W2 and on the surface layer of the rear surface W2b, or may be formed either inside the second substrate W2 or on the surface layer of the rear surface W2b.

Also, the formation of the modification layer M within the first substrate W1 (within the second substrate W2) and the formation of the modification layer M on the surface layer of the rear surface W1b of the first substrate W1 (the surface layer of the rear surface W2b of the second substrate W2) may be performed by different modification devices. In such a case, the modification device configured to form the modification layer M on the surface layers of the rear surfaces W1b and W2b may use a laser beam having a wavelength that does not transmit through the first substrate W1 and the second substrate W2.

The substrate processing system 1 according to the above-described exemplary embodiment includes the modification device 30, the bonding device 31 and the processing device 32, but the configuration of the substrate processing system 1 is not limited thereto. For example, the bonding device 31 and the processing device 32 may be provided outside the substrate processing system 1.

Figure 11:
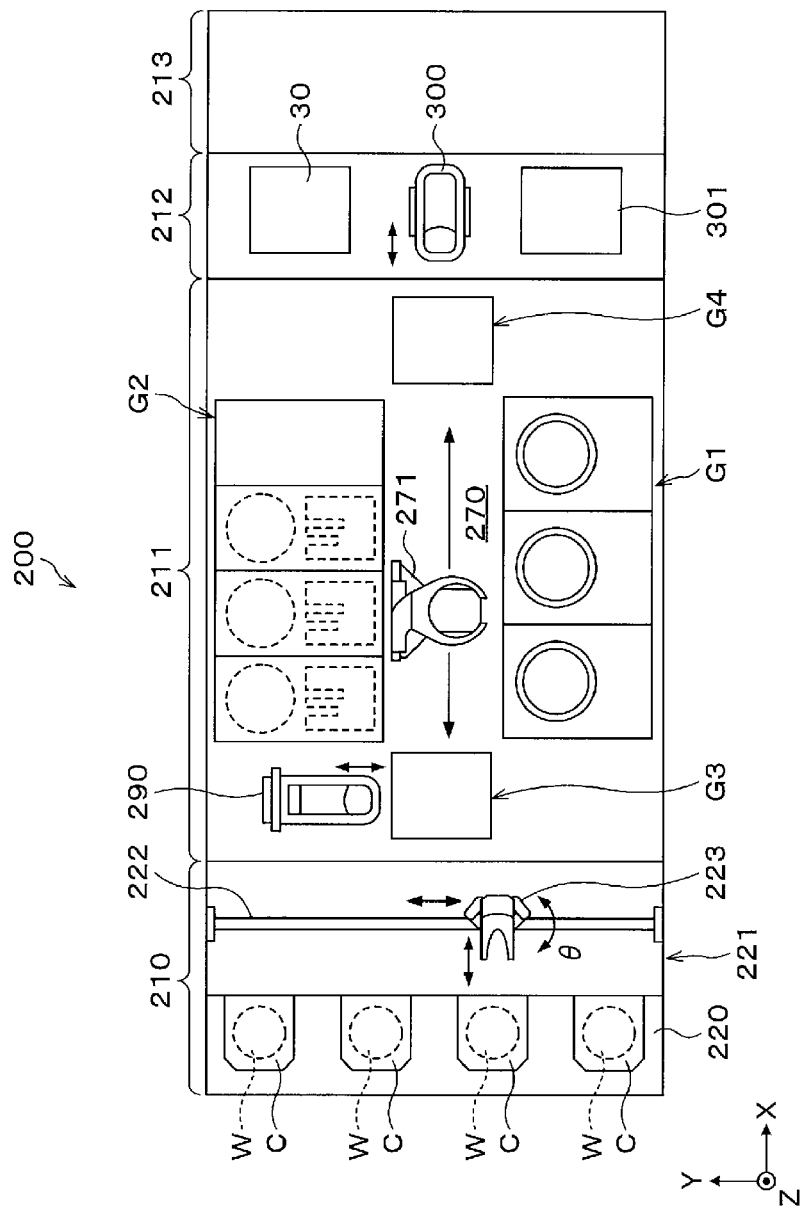
FIG. 11 is a plan view schematically illustrating a configuration of a substrate processing system according to a second exemplary embodiment.
Figure 12:
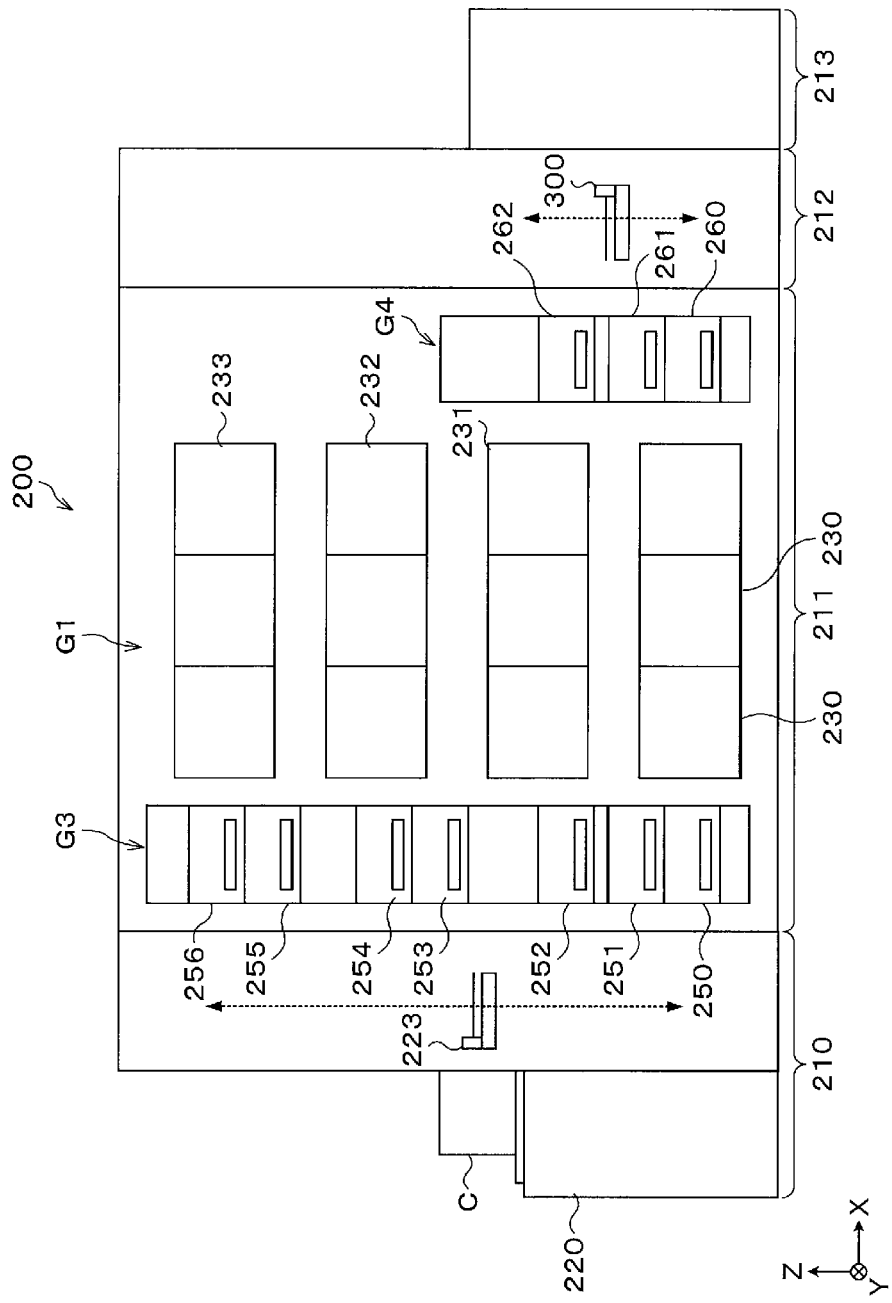
FIG. 12 is a side view schematically illustrating an internal configuration of the substrate processing system according to the second exemplary embodiment.
Figure 13:
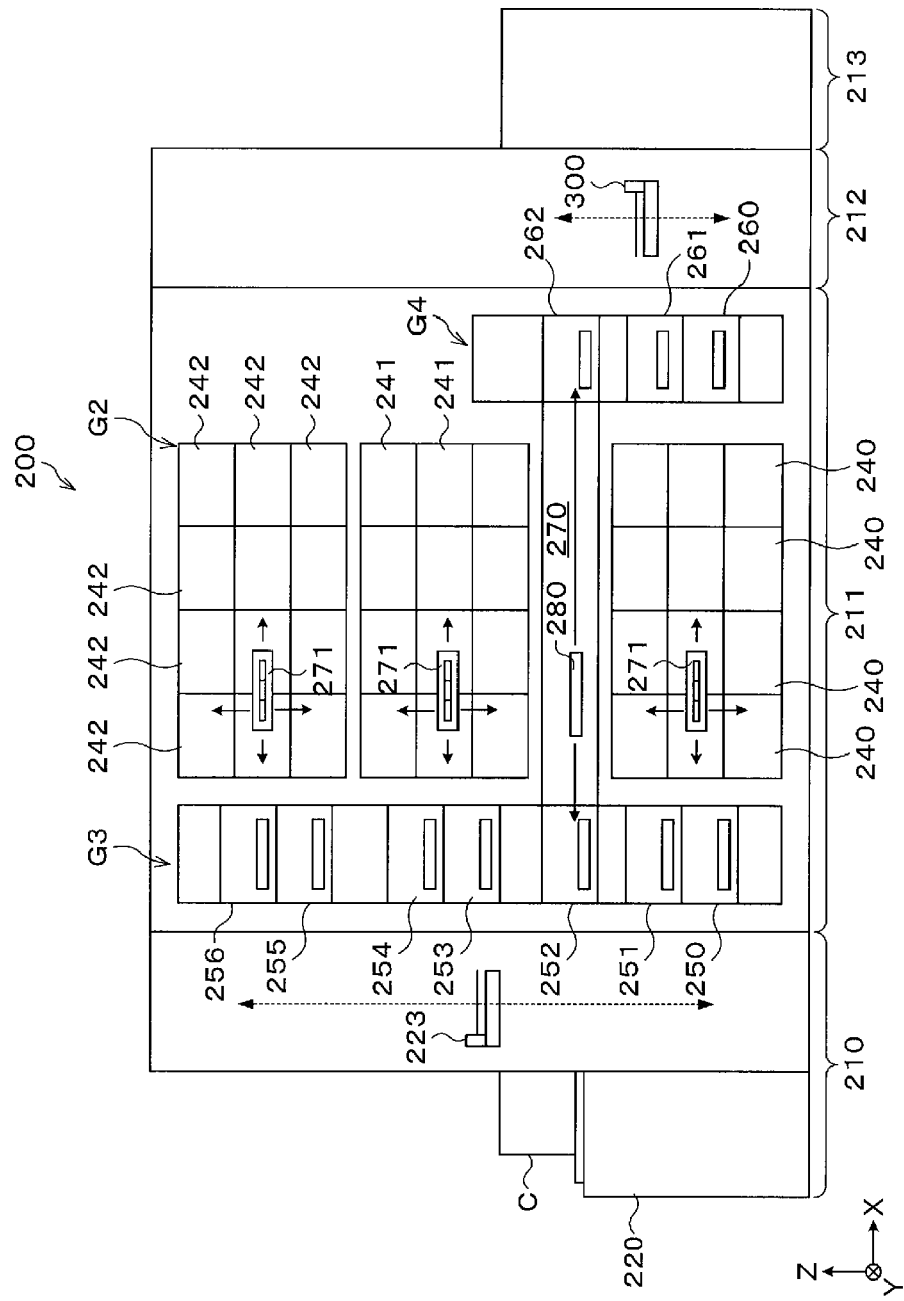
FIG. 13 is a side view schematically illustrating the internal configuration of the substrate processing system according to the second exemplary embodiment.

Hereinafter, a configuration of a substrate processing system according to a second exemplary embodiment will be described. FIG. 11 is a plan view schematically illustrating a configuration of a substrate processing system 200. Each of FIG. 12 and FIG. 13 is a side view schematically illustrating an internal configuration of the substrate processing system 200. In the substrate processing system 200 according to the present exemplary embodiment, a photolithography processing is performed on the substrate W. The substrate W is a semiconductor substrate such as a silicon substrate.

As shown in FIG. 11, the substrate processing system 200 includes a carry-in/out station 210, a processing station 211 and an interface station 212 which are connected as one body. Cassettes C configured to accommodate therein a plurality of substrates W are carried in/out between the carry-in/out station 210 and, for example, the outside. The processing station 211 includes various processing devices configured to perform predetermined processings on the substrate W. The interface station 212 is adjacent to the processing station 211 and is configured to deliver the substrate W to and from an exposure device 213 configured to perform an exposure processing on the substrate W.

In the carry-in/out station 210, a cassette placing table 220 is provided. In the illustrated example, a plurality of, for example, four cassettes C can be arranged in a row in the Y-axis direction on the cassette placing table 220. Further, the number of cassettes C arranged on the cassette placing table 220 is not limited to the present exemplary embodiment, but can be arbitrarily determined.

In the carry-in/out station 210, a transfer section 221 is provided adjacent to the cassette placing table 220. The transfer section 221 is equipped with a transfer device 223 which is movable along a transfer path 222 elongated in the Y-axis direction. The transfer device 223 is configured to be movable in the vertical direction around a vertical axis and around the vertical axis, and can transfer the substrate W between the cassettes C and a transit unit in a third block G3 of the processing station 211 which will be described below.

The processing station 211 is equipped with a plurality of, for example, four blocks, i.e., a first block G1 to a fourth block G4, including various devices. For example, the first block G1 is provided on the front side of the processing station 211 (on the negative side of the Y-axis direction in FIG. 11) and the second block G2 is provided on the back side of the processing station 211 (on the positive side of the Y-axis direction in FIG. 11). Further, the third block G3 is provided on the carry-in/out station 210 side (on the negative side of the X-axis direction in FIG. 11) of the processing station 211, and the fourth block G4 is provided on the interface station 212 side (on the positive side of the X-axis direction in FIG. 11) of the processing station 211.

In the first block G1, as shown in FIG. 12, a plurality of liquid processing devices, for example, a developing device 230, a bottom antireflection coating device 231, a coating device 232 and a top antireflection coating device 233 are arranged in this order from the bottom. The developing device 230 is configured to perform a developing processing on the substrate W. The bottom antireflection coating device 231 is configured to form an antireflection film under a resist film of the substrate W. The coating device 232 is configured to apply a resist liquid as a coating liquid onto the substrate W to form the resist film. The top antireflection coating device 233 is configured to form an antireflection film on the resist film of the substrate W.

For example, three developing devices 230, three bottom antireflection coating devices 231, three coating devices 232 and three top antireflection coating devices 233 are arranged in parallel with each other in the horizontal direction. Further, the number and the arrangement of the developing devices 230, the bottom antireflection coating devices 231, the coating devices 232 and the top antireflection coating devices 233 can be arbitrarily determined.

In the second block G2, as shown in FIG. 13, heating devices 240, hydrophobic processing devices 241 and peripheral exposure devices 242 are provided in parallel with each other in the vertical direction and the horizontal direction. The heating device 240 is configured to perform a heat treatment such as heating and cooling of the substrate W. The hydrophobic processing device 241 is configured to perform a hydrophobic processing to improve the adhesiveness between the resist liquid and the substrate W. The peripheral exposure device 242 is configured to expose an outer peripheral portion of the substrate W. Further, the number and the arrangement of the heating device 240, the hydrophobic processing device 241 and the peripheral exposure device 242 can be arbitrarily determined.

In the third block G3, transit units 250, 251, 252, 253, 254, 255 and 256 are provided in this order from the bottom. Further, in the fourth block G4, transit units 260, 261 and 262 are provided in this order from the bottom.

As shown in FIG. 11, a transfer section 270 is formed in a region surrounded by the first block G1 to the fourth block G4. In the transfer section 270, a plurality of transfer devices 271 configured to be movable, for example, in the horizontal direction, in the vertical direction and around the vertical axis is arranged. The transfer devices 271 can move within the transfer section 270 and transfer the substrates W to predetermined devices inside the surrounding first block G1, second block G2, third block G3 and fourth block G4.

Further, as shown in FIG. 13, a shuttle transfer device 280 configured to transfer the substrate W linearly between the third block G3 and the fourth block G4 is provided in the transfer section 270.

The shuttle transfer device 280 is linearly movable, for example, in the X-axis direction of FIG. 13. The shuttle transfer device 280 moves in the X-axis direction while supporting the substrate W and can transfer the substrate W between the transit unit 252 of the third block G3 and the transit unit 262 of the fourth block G4.

As shown in FIG. 11, a transfer device 290 configured to be movable, for example, in the horizontal direction, in the vertical direction and around the vertical axis is provided near the positive side of the Y-axis direction of the third block G3. The transfer device 290 moves up and down while supporting the substrate W and can transfer the substrate W to each transit unit in the third block G3.

In the interface station 212, a transfer device 300, a transit unit 301 and a modification device 30 are provided. The transfer device 300 is configured to be movable, for example, in the horizontal direction, in the vertical direction and around the vertical axis. The transfer device 300 can transfer the substrate W among each transit unit in the fourth block G4, the transfer device 301, the modification device 30 and the exposure device 213. The configuration of the modification device 30 is the same as that of the modification device 30 in the substrate processing system 1 according to the first exemplary embodiment. Meanwhile, in the modification device 30 of the present exemplary embodiment, the modification device 30 forms the modification layer M on a surface layer of a rear surface Wb of the substrate W.

Figure 14:
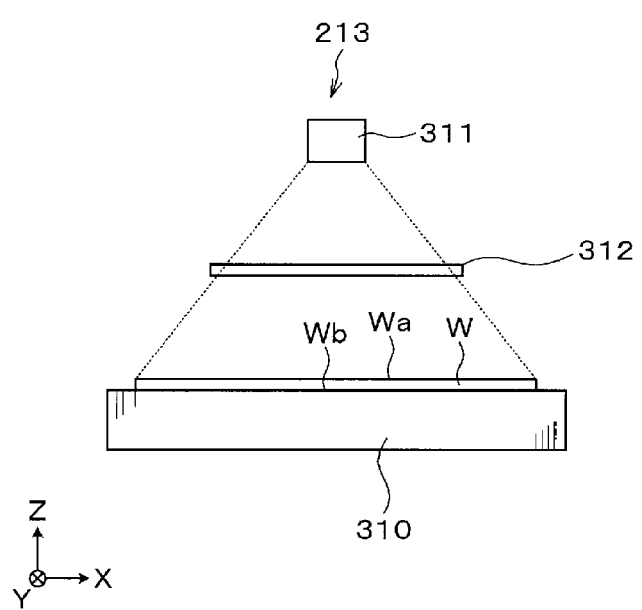
FIG. 14 is a schematic side view illustrating a configuration of an exposure device.

Hereinafter, the exposure device 213 will be described. As shown in FIG. 14, the exposure device 213 includes a placing table 310, a light source 311 and a mask 312. The placing table 310 is configured to attract and hold the rear surface Wb of the substrate W and place the substrate W thereon. The light source 311 is arranged above the placing table 310. The light source 311 is configured to radiate light on a front surface Wa of the substrate W placed on the placing table 310. The mask 312 is arranged between the placing table 310 and the light source 311. The mask 312 is printed with a predetermined pattern. Further, in the exposure device 213, the light is radiated from the light source 311 to the substrate W on the placing table 310 via the mask 312 to expose the resist film on the substrate W into the predetermined pattern.

Hereinafter, a substrate processing performed in the substrate processing system 200 configured as described above will be described.

First, the cassette C that accommodates the substrates W is placed on the cassette placing table 220 of the carry-in/out station 2.

Then, each substrate W is taken out of the cassette C by the transfer device 223 and transferred into the transit unit 253 of the third block G3 in the substrate processing station 211.

Then, the substrate W is transferred into the heating device 240 of the second block G2 by the transfer device 271 and subjected to the temperature adjustment. Thereafter, the substrate W is transferred into the bottom antireflection coating device 231 of the first block G1 by the transfer device 271, and the bottom antireflection film is formed on the substrate W. Thereafter, the substrate W is transferred into the heating device 240 of the second block G2 and subjected to the heat treatment. Then, the substrate W is returned back to the transit unit 253 of the third block G3.

Subsequently, the substrate W is transferred into the transit unit 254 of the third block G3 by the transfer device 290. Thereafter, the substrate W is transferred into the hydrophobic processing device 241 of the second block G2 by the transfer device 271 and subjected to the hydrophobic processing.

Then, the substrate W is transferred into the coating device 232 by the transfer device 271, and the resist film is formed on the substrate W. Thereafter, the substrate W is transferred into the heating device 240 by the transfer device 271 and subjected to a pre-baking. Thereafter, the substrate W is transferred into the transit unit 255 of the third block G3 by the transfer device 271.

Then, the substrate W is transferred into the top antireflection coating device 233 by the transfer device 271, and the top antireflection film is formed on the substrate W. Thereafter, the substrate W is transferred into the heating device 240 by the transfer device 271 and then heated to adjust the temperature thereof. Then, the substrate W is transferred into the peripheral exposure device 242 and subjected to the peripheral exposure processing.

Subsequently, the substrate W is transferred into the transit unit 256 of the third block G3 by the transfer device 271.

Thereafter, the substrate W is transferred into the transit unit 252 by the transfer device 290 and then transferred to the transit unit 262 of the fourth block G4 by the shuttle transfer device 280.

Subsequently, the substrate W is transferred into the modification device 30 by the transfer device 300 of the interface station 212, and the modification layer M is formed on the surface layer of the rear surface Wb. The modification layer M may be formed on the entire rear surface Wb of the substrate W or may be locally formed. Further, the formation of the modification layer M by the modification device 30 is performed in the same manner as in the first exemplary embodiment.

Then, the substrate W is transferred into the exposure device 213 by the transfer device 300, and then, exposed into the predetermined pattern. In the exposure device 213, the rear surface Wb of the substrate W is attracted and held by the placing table 310. In this case, as for a conventional exposure device, the friction may occur between the holding surface of the placing table 310 and the rear surface Wb of the substrate W, and may cause the stress on the substrate W. Further, when the stress is applied to the substrate W in this way, the substrate W is distorted. However, if the modification layer M is formed on the surface of the rear surface Wb of the substrate W by the modification device 30 as in the present exemplary embodiment, the rear surface Wb is roughened. Then, the frictional force between the roughened rear surface Wb and the holding surface of the placing table 310 decreases. As a result, the stress caused by the friction on the substrate W can be suppressed, and, thus, the distortion of the substrate W can be suppressed.

Thereafter, the substrate W is transferred into the transit unit 260 of the fourth block G4 by the transfer device 300. Then, the substrate W is transferred into the heating device 240 by the transfer device 271 and subjected to a post-exposure baking.

Subsequently, the substrate W is transferred into the developing device 230 by the transfer device 271 to be developed. After the development, the substrate W is transferred into the heating device 240 by the transfer device 290 and subjected to a post-baking.

Thereafter, the substrate W is transferred into the transit unit 250 of the third block G3 by the transfer device 271, and then, transferred into the cassette C on the cassette placing table 220 by the transfer device 223 of the carry-in/out station 210. Thus, a series of substrate processings is ended.

As described above, according to the present exemplary embodiment, the modification layer 30 is formed on the surface layer of the rear surface Wb of the substrate W by the modification device 30, and, thus, the frictional force between the rear surface Wb and the holding surface of the placing table 310 decreases. Then, the stress caused by the friction on the substrate W can be suppressed, and, thus, the distortion of the substrate W can be suppressed. As a result, the pattern can be appropriately formed at the predetermined position on the substrate W.

Here, a photolithography processing is performed a plurality of times on the substrate W to form a multilayered pattern. In this case, according to the present exemplary embodiment, the pattern in each layer can be appropriately formed at the predetermined position as described above, and, thus, the overlay (superposition accuracy) can be improved.

In the present exemplary embodiment, the modification device 30 may form the modification layer M within the substrate W as in the first exemplary embodiment. Distortion of the substrate W can be more reliably suppressed.

Further, when the rear surface Wb of the substrate W is attracted and held in the processing device of the substrate processing system 200 as in the exposure device 213, the modification layer M may be formed on the surface layer of the rear surface Wb of the substrate W before the processing in the processing device is performed.

The exemplary embodiments disclosed herein are illustrative and do not limit the present disclosure. Further, the above-described exemplary embodiments may be omitted, substituted, or changed in various forms without departing from the scope and spirit of the appended claims.

According to one aspect of the present disclosure, the front surface of the substrate is processed with high accuracy in the state that the rear surface of the substrate is held.

We claim:

1. A substrate processing method of processing a substrate, comprising:
   forming a modification layer on a surface layer of a rear surface of the substrate by radiating a laser beam; and
   processing a front surface of the substrate in a state that the rear surface of the substrate is held by a holder,
   wherein in the forming of the modification layer, the modification layer is formed on the surface layer of the rear surface of the substrate such that the rear surface is roughened, thereby decreasing a frictional force between the roughened rear surface of the substrate and a holding surface of the holder.

2. The substrate processing method of claim 1,
   wherein the substrate includes a first substrate and a second substrate,
   wherein in the forming of the modification layer, the modification layer is formed on a surface layer of a rear surface of the first substrate, and
   in the processing of the front surface, a front surface of the first substrate and a front surface of the second substrate are bonded to each other.

3. The substrate processing method of claim 2,
   wherein in the forming of the modification layer, the modification layer is further formed on a surface layer of a rear surface of the second substrate.

4. The substrate processing method of claim 2,
   wherein the processing of the front surface includes:
   placing the first substrate and the second substrate to face each other after the rear surface of the first substrate is vacuum-exhausted to be held by a first holder and a rear surface of the second substrate is vacuum-exhausted to be held by a second holder;
   pressing, by lowering a push member provided in the first holder and configured to press a central portion of the first substrate, the central portion of the first substrate and a central portion of the second substrate into contact with each other by the push member; and
   bonding the first substrate and the second substrate to each other sequentially from the central portion toward an outer peripheral portion of the first substrate in a state that the central portion of the first substrate and the central portion of the second substrate are pressed.

5. The substrate processing method of claim 1,
   wherein in the processing of the front surface, an exposure processing in a photolithography processing is performed on the front surface of the substrate.

* * * * *